United States Patent
Mulligan et al.

(10) Patent No.: US 6,805,946 B2
(45) Date of Patent: Oct. 19, 2004

(54) MULTI-FUNCTIONAL COMPOSITE STRUCTURES

(75) Inventors: Anthony C. Mulligan, Tucson, AZ (US); John Halloran, Ann Arbor, MI (US); Dragan Popovich, Glendale, AZ (US); Mark J. Rigali, Tucson, AZ (US); Manish P. Sutaria, Philadelphia, PA (US); K. Ranji Vaidyanathan, Tucson, AZ (US); Michael L. Fulcher, Tucson, AZ (US); Kenneth L. Knittel, Tucson, AZ (US)

(73) Assignee: Advanced Ceramics Research, Inc., Tucson, AZ (US)

(*) Notice: Subject to any disclaimer, the term of this patent is extended or adjusted under 35 U.S.C. 154(b) by 0 days.

(21) Appl. No.: 10/005,085

(22) Filed: Dec. 4, 2001

(65) Prior Publication Data

US 2002/0127384 A1 Sep. 12, 2002

Related U.S. Application Data

(60) Provisional application No. 60/251,212, filed on Dec. 4, 2000, and provisional application No. 60/293,595, filed on May 25, 2001.

(51) Int. Cl.$^7$ .............................. B32B 5/02; B32B 7/00; B32B 33/00
(52) U.S. Cl. ............................... 428/292.4; 428/293.1; 428/293.4; 264/104; 264/211.18
(58) Field of Search .......................... 428/292.4, 293.1, 428/293.4; 264/104, 211.18

(56) References Cited

U.S. PATENT DOCUMENTS

| | | | |
|---|---|---|---|
| 4,772,524 A | 9/1988 | Coblenz | |
| 4,788,096 A | 11/1988 | Kalnin et al. | |
| 5,053,092 A | 10/1991 | Lachman | |
| 5,133,494 A | * 7/1992 | Wang et al. | 228/122.1 |
| 5,175,709 A | 12/1992 | Slayton et al. | |
| 5,201,022 A | 4/1993 | Shifflett | |
| 5,398,193 A | 3/1995 | Deangelis | |
| 5,588,997 A | 12/1996 | Lysson et al. | |
| 5,645,781 A | 7/1997 | Popovic' et al. | |
| 5,679,157 A | 10/1997 | Milliman | |
| 5,869,189 A | 2/1999 | Hagood, IV et al. | |
| 6,063,502 A | 5/2000 | Sue et al. | |
| 6,193,001 B1 | 2/2001 | Eyre et al. | |
| 6,203,752 B1 | 3/2001 | Bwelay et al. | |
| 6,235,165 B1 | 5/2001 | Wakasono | |
| 6,315,065 B1 | 11/2001 | Yong et al. | |
| 6,325,165 B1 | 12/2001 | Eyre | |
| 6,361,873 B1 | 3/2002 | Yong et al. | |
| 6,451,442 B1 | 9/2002 | Sue et al. | |
| 2002/0127384 A1 | 9/2002 | Mulligan et al. | |
| 2002/0154741 A1 | 10/2002 | Rigali et al. | |

FOREIGN PATENT DOCUMENTS

WO    WO 01/53059 A1    7/2001

OTHER PUBLICATIONS

PCT International Search Report mailed Apr. 23, 2003 (PCT/US02/38648).
PCT International Search Report mailed Feb. 25, 2003, (PCT/US02/38804).
PCT International Search Report mailed Feb. 28, 2003, (PCT/US02/38654).

(List continued on next page.)

*Primary Examiner*—John J. Zimmerman
*Assistant Examiner*—Jason L Savage
(74) *Attorney, Agent, or Firm*—Banner & Witcoff, Ltd.

(57) ABSTRACT

Fibrous monolith processing techniques to fabricate multi-functional structures capable of performing more than one discrete function such as structures capable of bearing structural loads and mechanical stresses in service and also capable of performing at least one additional non-structural function.

27 Claims, 3 Drawing Sheets

OTHER PUBLICATIONS

PCT International Search Report mailed Mar. 6, 2003, (PCT/US02/38680).

J.J. Brennan and K. M. Prewo, "Silicon Carbide Fibre Reinforced Glass–Ceramic Matrix Composites Exhibiting High Strength and Toughness," *J. Mater. Sci.*, 17 2371–83 (1982).

G. Hilmas, et al., "Fibrous Monoliths: Non–Brittle Fracture from Powder–Processed Ceramics," *Mat. Sci. & Eng.* A195, 263–268 (1995).

G.E. Hilmas, et al., "SiC and $Si_3N_4$ Fibrous Monoliths: Non–Brittle Fracture From Powder Processed Ceramics Produced by Coextrusion," vol. 51 *Ceramic Processing Science and Technology*, pp. 609–614 (1993).

H. Kodama, et al., "Silicon Carbide Monofilament–Reinforced Silicon Nitride or Silicon Carbide Matrix Composites," *J. Am. Ceram. Soc.*, 72 [4] 551–58 (1989).

D. Kovar, et al., "Fibrous Monolithic Ceramics" J. Am. Ceram. Soc., 80 [10] 2471–2487 (1997).

P.J. Lamicq, et al., "SiC/SiC Composite Ceramics," *Am. Ceram. Soc. Bull.*, 65 [2] 336–38 (1986).

T.I. Mah, et al., "Recent Developments in Fiber–Reinforced High Temperature Ceramic Composites," *Am. Ceram. Soc. Bull.*, 66 [2] 304–08 (1987).

K.M. Prewo, "Fiber–Reinforced Ceramics: New Opportunities for Composite Materials," *Am. Ceram. Soc. Bull.*, 68 [2] 395–400 (1989).

K.M. Prewo and J.J. Brennan, "High–Strength Silicon Carbide Fibre–Reinforced Glass–Matrix Composites," *J. Mater. Sci.*, 15 463–68 (1980).

J.R. Strife, et al., "Status of Continuous Fiber–Reinforced Ceramic Matrix Composite Processing Technology," *Ceram. Eng. Sci. Proc.*, 11 [7–8] 871–919 (1990).

\* cited by examiner

MULTI-FUNCTIONAL COMPOSITE STRUCTURES

CROSS-REFERENCE TO RELATED APPLICATIONS

This application is based on, and claims the benefit of, co-pending U.S. Provisional Application Serial No. 60/251,212, filed on Dec. 4, 2000, and entitled "Smart Fibrous Monolith Multi-Functional Components," and co-pending U.S. Provisional Application Serial No. 60/293,595, filed on May 25, 2001, and entitled "A Method of Fabricating Electro-Mechanical Smart Structures Having Embedded Electrodes."

This invention was made with U.S. Government support under grant Number DE-FC26-01NT41051 awarded by the Department of Energy, and grant Number DASG60-00C-0069 awarded by the Ballistic Missile Defense Organization. Accordingly, the Government may have certain rights in the invention described herein.

FIELD OF THE INVENTION

The present invention relates to fibrous monolith components capable of performing multiple functions and processes for preparing such components. More particularly, the present invention is directed to structures capable of more than one discrete function, such as those capable of bearing structural loads and mechanical stresses in service and also capable of performing non-structural functions, including strain measurement, power generation, and/or temperature measurement.

BACKGROUND OF THE INVENTION

Multitask functions typically are performed using different components within a system. In other words, the system contains more than one linked component each with its own discrete function. These systems, however, contain many limitations and disadvantages due to the number and types of components required to perform the various tasks. Size and weight restrictions, material compatibility, effective linkage between components and cost, for example, all must be considered when designing systems.

A smart material is one that receives, transmits, or processes a stimulus and responds by producing a useful effect. One example of a smart material is a shape memory alloy. When perturbed from its original shape, for example through bending, a shape memory alloy is capable of returning to its original shape when subjected to certain thermal treatments. In general, a component composed of a shape memory alloy can be deformed at a relatively low temperature and upon heating to a higher temperature will return to its original shape. Examples of shape memory alloys include gold-cadmium (AuCd), iron-platinum (FePt), nickel-titanium (NiTi), nickel-aluminum (NiAl), copper-zinc-aluminum (CuZnAl), and copper-aluminum-nickel (CuAlNi). Although such smart materials are known, typically, multiple materials must still be used in a system to perform differing functions within the system.

Another example of a smart material is a component having electro-mechanical functionality. Such a component can produce an electric field when exposed to a change in dimension caused by an imposed mechanical force (piezoelectric or generator effect), or conversely, can produce mechanical deformation or a change in shape when exposed to an applied electric field (electrostrictive or motor effect). Typically, piezoelectric and/or electrostrictive ceramics are used as the basis for electro-mechanical functionality.

Examples of piezoelectric and/or electrostrictive ceramics include lead zirconate titanate (PZT), lead lanthanum zirconate titanate (PLZT), lead barium zirconate titanate (PBZT), lead stannate zirconate titanate (PSZT), lead magnesium niobate (PMN), aluminum nitride (AlN) and barium titanate. These ceramics can be manufactured in almost any given shape or size, are chemically inert, and immune to moisture and other atmospheric conditions. Moreover, these ceramics exhibit multifunctional characteristics and are used in devices including transducers, linear actuators, vibrators, switches, speakers, benders, acoustic-canceling devices, sensors and smart systems.

Use of these piezoelectric and/or electrostrictive ceramics is limited by certain disadvantages of the materials. One significant disadvantage is that the ceramics tend to be brittle and weak. Thus, tensile strength limitations are often a limiting factor in design systems utilizing these materials.

Poling of piezoelectric and/or electrostrictive ceramics is an important aspect of the manufacture of transducers. During the poling process, a strong electric field is applied to the ceramic and then removed. This results in a poling field with the same orientation as the initial electric field. The poling process, however, is a challenging task that often results in electric breakdown before the poling process is complete, thus ruining the transducer. As a result, piezoelectric/electrostrictive ceramics must be fabricated with electrodes located on the inside and the outside, thus resulting in lower poling and driving fields. However, the fabrication of complex piezoelectric and/or electrostrictive ceramic structures having electrodes located on both the inside and outside is not an easy task. Conventional methods of fabricating these complex structures are expensive and time consuming.

Accordingly, there exists a need for materials that have improved mechanical properties and are capable of performing multiple tasks (both structural and non-structural) within a system to increase system reliability, reduce system complexity, reduce costs and otherwise improve design limitations encountered heretofore with use of conventional materials. There further exists a need in the industry for low cost, versatile techniques for the fabrication of such materials, including structures having internal or embedded electrodes and sensors.

SUMMARY OF THE INVENTION

The present invention overcomes the problems encountered in conventional systems and methods of manufacture by providing materials having properties that allow the materials to be used to perform multiple tasks while providing enhanced structural benefits within a particular system. The present invention also provides methods of fabricating multifunctional ceramic structures using fibrous monolith processing technology. The present invention further provides for easy poling and low driving voltage of piezoelectric and/or electrostrictive components and reduces costs by eliminating labor and special machining, and increases development cycle and design reliability.

DETAILED DESCRIPTION OF THE INVENTION

The present invention relates to multifunctional structures capable of more than one discrete function and to fibrous monolith ("FM") processing techniques for fabricating the same. More particularly, the present invention utilizes FM materials having enhanced mechanical properties such as excellent refractory properties for high temperature oxidative and ablative environments, good flexure strength, high-fracture toughness, power generation, non-catastrophic failure, high resistance to oxidation, very high melting point, thermal shock resistance, and radiation hardening neutron absorption and their use as smart materials. The materials of the present invention may be used to fabricate structural components that have multi-functional, or "smart," characteristics. That is, the components are capable, for example, of bearing structural loads and mechanical stresses, as well as performing one or more non-structural functions. The components maintain a high level of performance and reliability as a structural component.

Composites of the present invention may be used in a wide variety of applications, including missile casings, rockets, hypersonic vehicle leading edges and fins, electronic casings for kinetic kill vehicles, radiation shields, cutting tools and mining tools. Examples of smart or multifunctional structures in accordance with the present invention include: (1) a nozzle or thruster on a rocket engine that is capable of generating an electric current and supplying power to other systems on the rocket during engine operation, (2) a nozzle or thruster on a rocket engine that is capable of measuring its operating temperature as the rocket propellant burns during rocket engine operation, (3) a drill bit that is capable of measuring its own temperature and the strain applied to its working surface during the performance of a drilling operation, and (4) a load bearing spring, such as in automotive shocks and/or struts, that is capable of measuring and outputting information on dynamic loads during vehicle operation.

As used herein, "fibrous monolithic composite" and "fibrous monolith" are intended to mean a ceramic and/or metallic composite material that includes a plurality of monolithic fibers, or filaments, each having at least a cell phase surrounded by a boundary phase but may include more than one core and/or shell phase. Fibrous monoliths exhibit the characteristic of non-brittle fracture, such that they provide for non-catastrophic failure.

As used herein, "cell phase" is intended to mean a centrally located primary material of the monolithic fiber, that is dense, relatively hard and/or strong. The cell phase extends axially through the length of the fiber, and, when the fiber is viewed in transverse cross-section, the cell phase forms the core of the fiber. The "cell phase" also may be referred to as a "cell" or "core".

As used herein, "boundary phase" is intended to mean a more ductile and/or weaker material that surrounds the cell phase of a monolithic fiber in a relatively thin layer and that is disposed between the various individual cell phases, forming a separating layer between the cell phase and surrounding cell phases when a plurality of fibers are formed in a fibrous monolithic composite. The "boundary phase" also may be referred to as a "shell," "cell boundary" or "boundary".

Fibrous monoliths ("FMs") are a unique class of structural ceramics that have mechanical properties similar to continuous fiber reinforced ceramic composites (CFCCs). Such properties include relatively high fracture energies, damage tolerance, and graceful failures. In contrast to CFCCs, FMs can be produced at a significantly lower cost. FMs, which are monolithic ceramics, generally are manufactured by powder processing techniques using inexpensive raw materials. As a result of the high performance characteristics of FMs and the low costs associated with manufacture of FMs, FMs are used in a wider range of applications than heretofore typical for ceramic composites.

Figure 1:
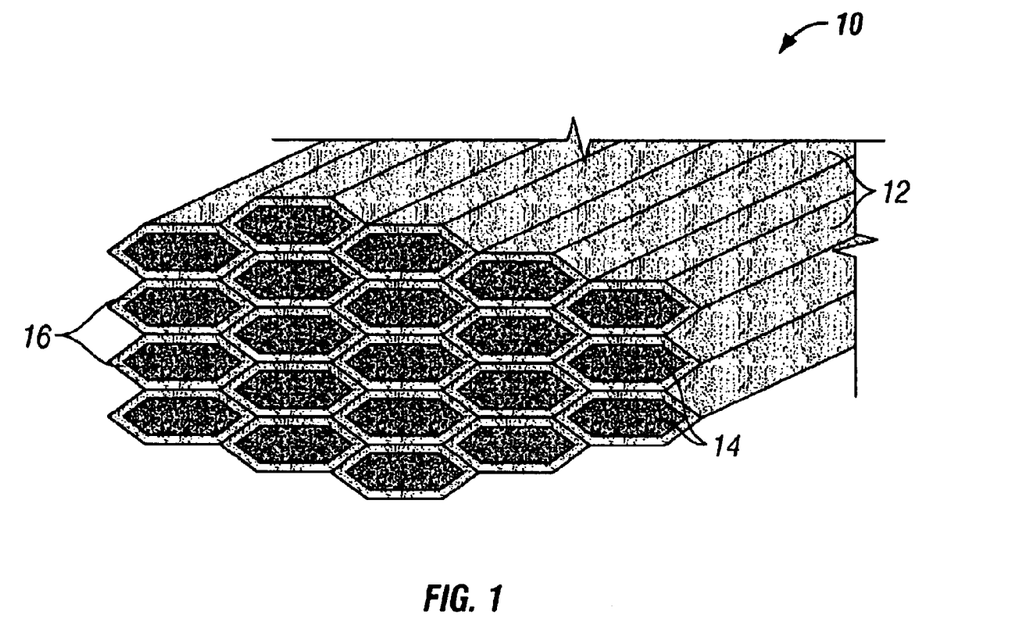
FIG. 1 is a perspective cross-sectional view of a uniaxial fibrous monolith composite in accordance with the present invention.

As shown in FIG. 1, the macroarchitecture of an FM composite 10 generally includes multiple filaments 12 each comprising at least two distinct materials —a primary phase in the form of elongated polycrystalline cells 14 separated by a thin secondary phase in the form of cell boundaries 16. Typical volume fractions of the two phases are between about 50 to about 99% of the fiber for the primary phase (polycrystalline cell) and between about 1 to about 50% of the fiber for the interpenetrating phase (cell boundary). Preferably, the volume fractions are between about 80 to about 95% for the primary phase (polycrystalline cell) and between about 5 to about 20% for the interpenetrating phase (cell boundary). The primary or cell phase typically consists of a structural material of a metal, metal alloy, carbide, nitride, boride, oxide, phosphate or silicide and combination thereof. The cells are individually surrounded and separated by cell boundaries of a tailored secondary phase. Powders that may be used in the secondary phase include compounds to create weak interfaces such as fluoromica, and lanthanum phosphate; compounds to create porosity in a layer which function to create a weak interface; graphite powders and graphite-containing powder mixtures; and hexagonal boron nitride powder and boron nitride-containing powder mixtures. If a metallic debond phase is desired, reducible oxides of metals may be used, e.g., nickel and iron oxides, or powders of metals, e.g., nickel, iron, cobalt, tungsten, aluminum, niobium, silver, rhenium, chromium, or their alloys.

Advantageously, powders which may be used in the cell and/or boundary phase composition to provide the green matrix filament include diamond, graphite, ceramic oxides, ceramic carbides, ceramic nitrides, ceramic borides, ceramic silicides, metals, and intermetallics. Preferred powders for use in that composition include aluminum oxides, barium oxides, beryllium oxides, calcium oxides, cobalt oxides, chromium oxides, dysprosium oxides and other rare earth oxides, hafnium oxides, lanthanum oxides, magnesium oxides, manganese oxides, niobium oxides, nickel oxides, tin oxides, aluminum phosphate, yttrium phosphate, lead oxides, lead titanate, lead zirconate, silicon oxides and silicates, thorium oxides, titanium oxides and titanates, uranium oxides, yttrium oxides, yttrium aluminate, zirconium oxides and their alloys; boron carbides, iron carbides, hafnium carbides, molybdenum carbides, silicon carbides, tantalum carbides, titanium carbides, uranium carbides, tungsten carbides, zirconium carbides; aluminum nitrides, cubic boron nitrides, hexagonal boron nitrides, hafnium nitride, silicon nitrides, titanium nitrides, uranium nitrides, yttrium nitrides, zirconium nitrides; aluminum boride, hafnium boride, molybdenum boride, titanium boride, zirconium boride; molybdenum disilicide; lithium and other alkali metals and their alloys; magnesium and other alkali earth metals and their alloys; titanium, iron, nickel, chromium, cobalt, molybdenum, tungsten, hafnium, rhenium, rhodium, niobium, tantalum, iridium, platinum, zirconium, palladium and other transition metals and their alloys; cerium, ytterbium and other rare earth metals and their alloys; aluminum; carbon; lead; tin; and silicon.

Compositions comprising the cell phase differ from those comprising the boundary phase in order to provide the benefits generally associated with FMs. For example, the compositions may include formulations of different compounds (e.g., HfC for the cell phase and WRe for the boundary phase or WC—Co and W—Ni—Fe) or formulations of the same compounds but in different amounts (e.g., WC-3%Co for the cell phase and WC-6%Co for the boundary phase) as long as the overall properties of the compositions are not the same. For example, the compositions can be selected so that no excessively strong bonding occurs between the two phases in order to limit crack deflection.

Figure 2:
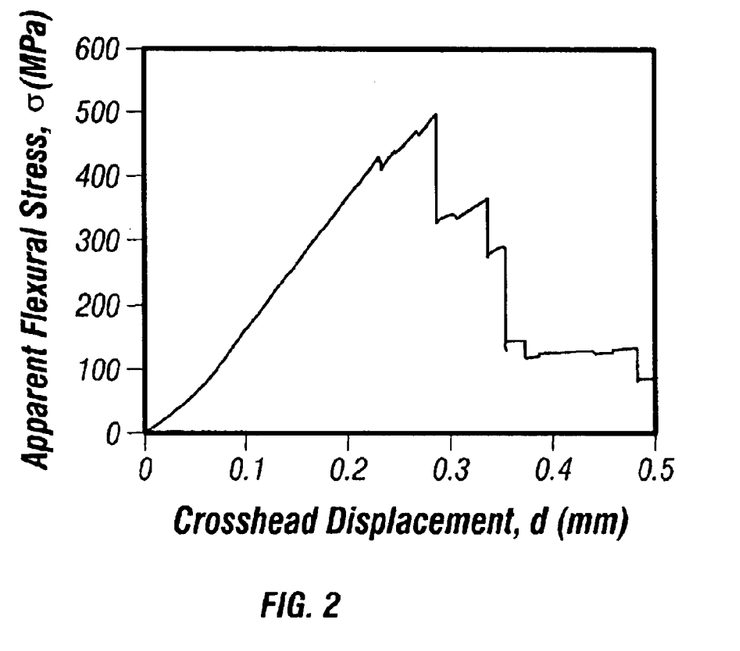
FIG. 2 is a graphical illustration of flexural stress as a function of displacement for a fibrous monolith composite in accordance with the present invention.

The cell boundary phase may be selected to create pressure zones, microcrack zones, ductile-phase zones, or weak debond-type interfaces in order to increase the toughness of the composite. For example, low-shear-strength materials such as graphite and hexagonal boron nitride make excellent weak debond-type cell boundaries and are present in $Si_3N_4$/BN and SiC/Graphite FM composites. The weak BN and graphite interfaces deflect cracks and delaminate thereby preventing brittle failure of these composites and increasing their fracture toughness. As a result, FM structures exhibit fracture behavior similar to CFCCs, such as C/C and SiC/SiC composites, including the ability to fail in a non-catastrophic manner. By way of example, typical flexural stress as a function of displacement for a $Si_3Ni_4$/BN FM material is shown in FIG. 2, which illustrates that fibrous monolith composites are non-brittle and retain significant load bearing capability after fracturing is initiated.

FM composites as smart materials provide the numerous benefits associated with FM composites, including enhanced mechanical properties and reduced production costs. FM composites also allow two or more desired materials to be incorporated into one composite material, thereby combining the functional properties of the two materials. Among the advantages associated with the combination of materials in such a way is a reduction in the size and weight of a structure formed of the material, while imparting the beneficial properties of the materials, which are maintained or even enhanced as a result of being incorporated in the composite with other materials, to the structure. For example, the size of thermoelectric material junctions can be controlled during fibrous monolith fabrication such that a larger number of junctions can be included in a given area than could be produced in the same area using conventional processing techniques, resulting in an increase in both the gravimetric and volumetric potential densities of the structure.

Low shear strength and compliant cell boundaries, such as BN and graphite, accommodate the expansions and contractions that occur during thermal cycling of the FM composite components, thereby resulting in improved thermal shock resistance. From the mechanical behavior viewpoint, such cell boundaries enable non-catastrophic failure due to stress delocalization and crack deflection mechanisms at both room and elevated temperatures. In addition, the presence of a ductile or relatively ductile cell boundary phase increases the damage tolerance and wear resistance of the FM composite. Without intending to be limited by any theories, it is believed that the improvement in damage tolerance of the present composites is attributed to the FM architecture in which the cell boundary absorbs and deflects crack energy during impact so that damage, when it occurs, is isolated to the individual micron-sized cells.

Figure 3:
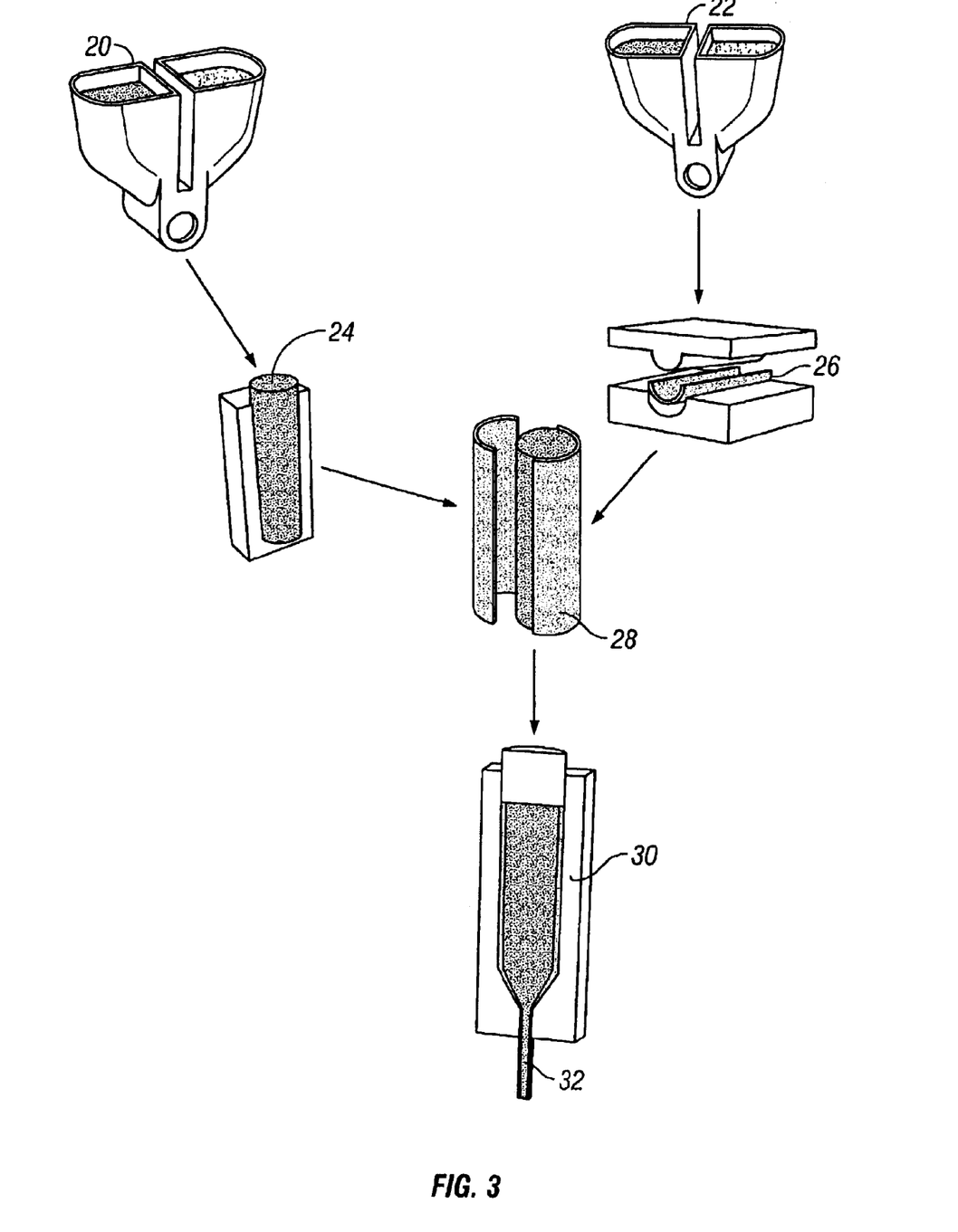
FIG. 3 is a schematic flow diagram showing a process of preparing composite filaments in accordance with the present invention.

Various methods of preparing fibrous monolithic filaments are known in the art, including the methods disclosed in U.S. Pat. No. 5,645,781, which is incorporated by reference herein in its entirety. Generally, as illustrated in FIG. 3, the process of preparing fibrous monolithic filaments in accordance with the present invention includes separately blending the starting materials for a core 20 and shell 22, forming the core 24 having a first composition and forming the shell 26 having a second composition, forming the feed rod 28 from the core and shell, and extruding the feed rod 30 one or more times to provide a polymer/ceramic filament 32. The filaments may then be formed and/or arranged to provide the desired structure in accordance with the present invention.

Fibrous monolith composites are fabricated using commercially available ceramic and metal powders using a process for converting ordinary ceramic powder into a "green" fiber that include the powder, a thermoplastic polymer binder and other processing aids. The fiber is compacted into the "green" state to create the fabric of elongated polycrystalline cells that resemble a fiber after sintering or hot pressing. The process is widely applicable, and allows a cell/cell boundary bi-component fiber to be made from a thermodynamically compatible set of materials available as sinterable powders. The scale of the microstructure is determined by the green fiber diameter (cell size) and coating thickness (cell boundary). Once the green composite fiber is fabricated it can be formed using any method known to those skilled in the art into the shape of the desired component having, for example, conventional composite architecture (e.g., uniaxial lay-up, biaxial lay-up, woven fabric, etc.). The thermoplastic binder is removed in a binder burnout step, and the component is hot pressed or sintered to obtain a fully consolidated and densified component.

The core and shell of the feed rod are formed of mechanically activated and agglomerate-free powders. The powders, such as the metals, alloys, carbides, nitrides, borides, oxides and silicides listed above, are selected to provide the desired mechanical properties in the final composite. A wide variety of combinations of powders may be used for the core and shell materials. Powders having particle size distributions in the range of about 0.01 to about 100 microns ($\mu$) in size may be used. Preferably, the particle size of the powder is between about 1 to about 10 microns.

Milling stations such as commercially available from Boston Gear, Boston, Mass. may be used as needed to ball mill the ceramic powder to obtain the desired size distribution. The desired ceramic powder preferably is ball milled with ethanol. The ceramic/ethanol blend is ball milled with milling media such as silicon nitride ($Si_3N_4$) or zirconium oxide ($ZrO_2$) thus creating a ball-mill slurry. Sintering aids such as, for example, aluminum oxide ($Al_2O_3$) and yttrium oxide ($Y_2O_3$) additions to $Si_3N_4$, when necessary, are added and milled together with the ball mill slurry. The powders are milled for a time effective for providing desired particle sizes and distribution. Typical milling times are between about 24 to about 120 hours, depending on the starting ceramic material. For example, boron nitride (BN) powder is milled for about 12 to 24 hours, silicon nitride powder is milled for about 24 hours, and zirconium carbide (ZrC), purchased as a fairly coarse refractory ceramic, is typically milled for a longer period, about 72 to 120 hours.

Upon completion of the milling operation, the ball mill slurry is collected from the milling station and the ceramic/ ethanol mixture is separated from the milling media using a perforated mill jar lid as a "strainer". The ethanol is separated from the ceramic powder using a Buchi Rotavapor separator commercially available from Brinkman Instruments Inc. of Westbury, N.Y. Solvent is evaporated from the ball-milled slurry in the Buchi Rotavapor separator and the ceramic powder dried. Ethanol solvent may be reclaimed as desired for reuse or proper disposal according to local, state, and federal waste disposal requirements. The ceramic powders are removed from the separator jar and placed in labeled plastic jars.

The individual ceramic powders are blended with thermoplastic melt-spinnable polymer binders, as well as one or more processing aids such as plasticizers as necessary, using a high shear mixer commercially available from C. W. Brabender of South Hackensack, N.J. or from Thermo Haake of Paramus, N.J., to form a smooth, uniformly suspended composite blend also referred to as a "dope". Examples of thermoplastic binders include ethylene ethylacetate (EEA) commercially available as DPDA-618NT from Union Carbide, ethylene vinylacetate (EVA) commercially available as ELVAX 470 from E.I. DuPont Co., and Acryloid Copolymer Resin (B-67) commercially available from Rohm and Haas, Philadelphia, Pa. Examples of plasticizers include heavy mineral oil (HMO) commercially available as Mineral Oil White, Heavy, Labguard® and methoxy polyethyleneglycol having a molecular weight of about 550 (MPEG-550) commercially available from Union Carbide. The composite blend is compounded at about 150° C. while metering a viscosity-modifying additive until a viscosity is obtained that will ensure desired rheology for a molten fiber extrusion process.

Because the mixers have fixed volume reservoirs, the recipes for the thermoplastic/ceramic blends produced in batches are formulated on a volumetric, as opposed to a gravimetric, basis. As an example, one blend consists of between about 50 to about 62 vol. % of the ceramic powder, between about 37 to about 50 vol. % of the thermoplastics, and between about 0 to about 12 vol. % of the plasticizers. Thus, the mass of a batch of ceramic/thermoplastic dope varies with the density of the ceramic powder. By way of example, a batch of $Si_3N_4$ with a density of 3.44 g/cc produces approximately 1 kg of "green" compound material.

After mixing, the composite blends are warm-pressed into a green composite feed rod. A composite feed rod consists of a "core" of a primary ceramic material enclosed by a cladding or "shell" of a second ceramic material. A preferred feed rod pressing station includes a hydraulic vertical press with one or more heated cylindrical dies, which allows the cores to be pressed. A heated uniaxial platen press, such as commercially available from Carver Inc., of Wabash, Ind. is used to press the shells for the composite feed rods. The volume ratio of the core and shell of a composite feed rod can be systematically varied to any desired ratio by using different sets of machine tooled core and shell dies. By way of example, "green" composite feed rods (22 mm in diameter) with the following core/shell volume ratios are commonly produced: 90/10, 82.5/17.5, 69/31, and 50/50.

A pressed feed rod is extruded. One extrusion process includes a computer numerically controlled (CNC) ball-screw extruder, including a ball screw from Thomson Saginaw of Saginaw, Mich. connected to a CNC directed current (DC) servomotor from Compumotor, Rohnert Park, Calif. The ball screw is connected to a brass metal rod that is used to pressurize and extrude the contents of the heated cylindrical die. The entire assembly is mounted and held vertically in a metal framework. Composite feed rods are extruded through a spinneret to produce a green fiber filament or "spaghetti". This process also is referred to as "single filament co-extrusion"(SFCX).

Typical filament sizes are 100 $\mu$m, 250 $\mu$m, 320 $\mu$m, 500 $\mu$m, 750 $\mu$m, 1 mm, 2 mm or 4 mm in diameter. Filaments having diameters between about 0.01 and about 10 mm may be extruded using a spinneret fabricated with the appropriate orifice diameter. The extruded filaments maintain the volume ratio of the original feed rod despite significant differences in diameters, such as a starting feed rod diameter of 22 mm and an extruded filament diameter of 250 $\mu$m (which is approximately 100 times smaller than the starting feed rod diameter). Use of thermoplastic/ceramic blends having appropriate rheological properties for the cores and shells maintain the volume ratio of the original feed rod. Preferably, the viscosity of the core material is approximately equivalent to the viscosity of the shell material. Use of core and shell materials with approximately equivalent viscosities provides improved flow stability and control to assist with maintaining the original geometry of the feed rod.

In general, filaments having diameters of no more than about 250 $\mu$m can be obtained by single filament co-extrusion. Smaller diameter green filaments may be readily broken during the winding and extrusion process, thereby limiting the ability to produce filaments having smaller diameters. To obtain cell sizes smaller than 250 $\mu$m, filaments having diameters of between about 1 to about 2 mm may be extruded and bundled together to form a multifilament feed rod having a diameter of about 22 mm. This feed rod is then extruded through a spinneret to produce multifilament spaghetti. Using this multifilament co-extrusion (MFCX) procedure, cell sizes approaching 10 or less microns can be produced.

Figure 4:
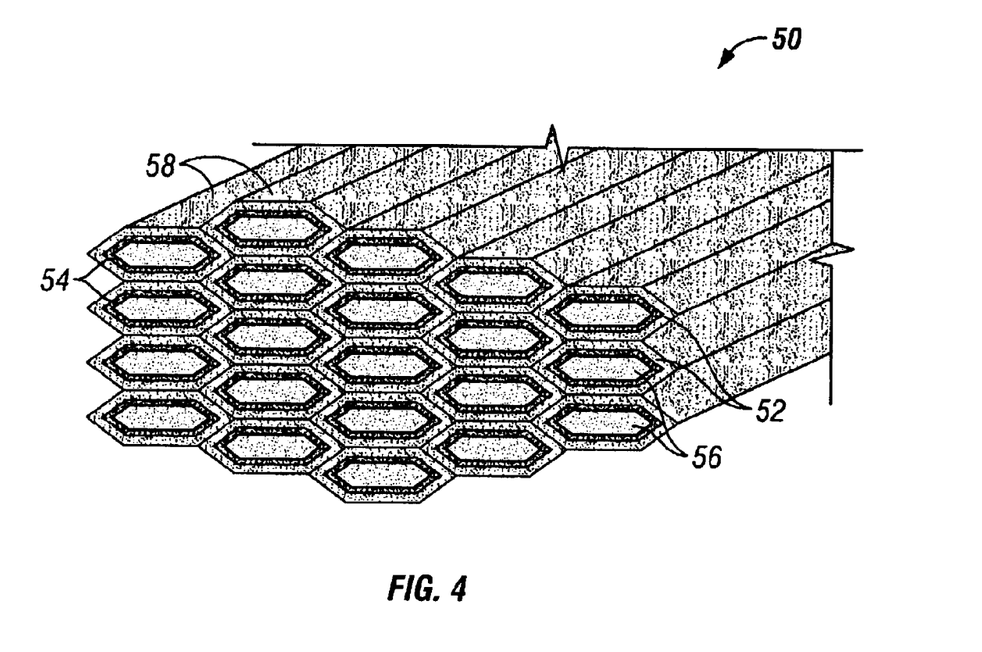
FIG. 4 is a perspective cross-sectional view of a uniaxial fibrous monolith composite showing a tertiary composite system in accordance with the present invention.

Tertiary or greater FM systems also may be prepared in accordance with the present invention to provide the benefits of the properties of the additional composition and/or to insulate the shell material. A tertiary FM system 50 is shown in FIG. 4. The tertiary system 50 includes a second ceramic phase 52 of either a material different from that of the inner, first ceramic phase 56 or a material the same as or similar to that of the first ceramic phase 56. The second ceramic phase 52 is disposed at the outer surface of each FM filament 58 and surrounds an intermediate boundary phase 54. Additional ceramic phase and/or boundary phase materials may be layered around the filaments as desired to perform additional functions in the system and/or impart additional properties to the system. For example, a core material in combination with a plurality of different shells may be used.

A plurality of filaments may be bundled together and disposed within another shell. This arrangement of filaments results in essentially a "honeycomb" configuration when arranged to form the FM composite. The bundled arrangement maintains the mechanical behavior of the filaments but insulates a "weaker" shell material from the external environment and any harsh conditions.

Numerous modifications and adjustments to the process for preparing filaments may be made to allow for variations in the particular compositions used to prepare the filaments. For example, viscosities may be adjusted, the diameter of the extrusion die may be changed, or the relative volumes of the core and shell may be changed. Other methods for extruding and/or otherwise forming the filaments known to those of skill in the art also may be utilized. For example, any modified process for continuous co-extrusion may be used.

The extruded, composite green filament generally is flexible and may be formed into the structures of the present invention. Generally, filaments may be bundled, woven, wound, braided, chopped, pressed, or laid up to produce essentially a near net shape pre-form. In a typical two-dimensional (2D) lay-up, the composite filament is wound on a computer numerically controlled (CNC) drum winder. The winder includes a rotating plastic drum driven by a servomotor from Compumotor, Rohnert Park, Calif. A single axis motion controller from Compumotor, Rohnert Park, Calif. is used to adjust the filament position as the filament is wound around the drum. Two-dimensional parts having a desired fiber alignment can be fabricated using the CNC drum winder.

After winding, composite filament sheets are cut to the desired shape and dimensions. The cut sheets can then be laid up in any standard 2D architecture (i.e. uniaxial, 0°/90°, quasi-isotropic, etc.). After the 2D pre-form is laid-up, a uniaxial platen press is used to warm laminate the component part.

In another embodiment of the present invention, the green filaments are grouped or bundled into a cylinder or other predetermined shape. The bundled filaments are cut to a predetermined length and machined, molded or otherwise formed to provide a structure having a desired shape and having the FM filaments extending generally parallel to the axis of the structure. One or more FM layers may be disposed across a surface of the structure as desired to provide increased enhancement of the mechanical properties of the structure. The FM composite structure is warm laminated to consolidate the FM filaments.

In another embodiment, the FM structure can be produced using rapid prototyping techniques as known to those skilled in the art or any modified rapid prototyping technique. For example, the feed rod can be loaded into a freeform fabrication apparatus having a heated barrel. A molten material is formed and directly feeds into a fine deposition nozzle having a volumetric flow rate that can be adjusted for high raw material throughput dispensing. The molten material is extruded through a high pressure nozzle onto a foam pad. The foam pad is mounted on a 4-axis, motorized, computer numerically controlled (CNC) platen. The solid freeform fabrication technique provides a complex part from one single, continuous fiber.

Although the invention is described with reference to generally cylindrical-shaped FM filaments that are bundled together to form FM composites wherein the shape of the filaments become essentially hexagonal in cross-section as a result of processing, other configurations are contemplated, as will be appreciated by those skilled in the art. For example, filaments having square, rectangular or triangular cross-sections may be obtained by varying the shape of the extrusion die accordingly. Additionally, the shape of the die used in the laminating step also may be modified accordingly as desired. Thus, different shapes and configurations of filaments in the FM composite may be obtained, which may impact the resultant mechanical properties of the FM composite.

A binder burnout furnace, such as commercially available from Lindberg, Watertown, Wis. is used to remove polymer binder from the formed composite coatings and FM composite structures. Sintering processes, including hot pressing, hot isostatic pressing or pressureless sintering, provide final consolidation and densification of the composite coatings and FM composite structures. A typical induction hot-press such as commercially available from Vacuum Industries, Somerville, Mass. is capable of a maximum temperature of 2400° C. and a maximum load of 100 tons and can be operated in several different environments including vacuum, argon, and nitrogen atmospheres.

In another embodiment of the present invention, multifunctional piezoelectric and/or electrostrictive structures having embedded electrodes are formed from fibrous monolith composites. In particular, the cell boundary material of the fibrous monolith composites include piezoelectric and/or electrostrictive ceramics, such as lead zirconate titanate (PZT), lead lanthanum zirconate titanate (PLZT), lead barium zirconate titanate (PBZT), lead stannate zirconate titanate (PSZT) and lead magnesium niobate (PMN), that become solid piezoelectric and/or electrostrictive structures. The cell materials include conductive ceramics, such as ruthenium oxide, and metal alloys, such as silver/palladium (Ag/Pd) and nickel titanium intermetallic (NiTi), or combinations thereof, that become a series of electrodes embedded within the piezoelectric and/or electrostrictive FM structures.

Powders used in this embodiment may be produced by a combustion synthesis technique. The combustion synthesis technique includes preparation of an aqueous solution containing metal nitrates and an organic fuel (e.g., sucrose or glycine). The aqueous solution is spray dried, causing spontaneous ignition of the droplets. The pyrolysis reaction between the nitrates and fuel leads to the formation of chemically homogeneous and fluffy precursor powders. The precursor powders are heated to a temperature and for a time effective for calcining the powders. As an example, the powders are calcined at about 800° C. for about five hours. They are then ball milled to deagglomerate the powders.

Powders exhibiting piezoelectric behavior that may be formed using this technique include $Pb_{0.945}La_{0.055}Zr_{0.56}Ti_{0.44}O_3$ and $Pb_{0.965}La_{0.055}Zr_{0.56}Ti_{0.44}O_3$ (with 5 wt % PbO as a sintering aid). Excess PbO is added as a sintering aid in order to obtain high sintering densities for atmosphere-fired fibers. Powders exhibiting electrostrictive behavior that may be formed using this technique include $Pb_{0.914}La_{0.086}Zr_{0.65}Ti_{0.35}O_3$ and $Pb_{0.924}La_{0.086}Zr_{0.65}Ti_{0.35}O_3$ (with 5 wt % PbO as a sintering aid). Excess PbO is added as a sintering aid in order to obtain high sintering densities for atmosphere-fired fibers. Phase pure and fully crystalline PLZT compositions may be produced in accordance with the present invention. The mean particle size ($d_{50}$) is between about 0.7 and 1.2 $\mu$m, as measured by a laser scattering technique.

Silver powders may be synthesized by a precipitation technique using silver nitrate and sodium hydroxide as starting compounds. Silver powders produced by this technique may include AgO+, $Ag_2O$ and surface oxidized Ag metal powder in addition to the pure Ag metal powder.

Fibrous monolith composites in accordance with this embodiment are prepared using the methods previously described. An exemplary PLZT composite blend contains the following: 55 vol. % PLZT powder; 17.5 vol. % ethylene vinyl acetate (EVA) copolymer; 17.5 vol. % ethylene ethyl acrylate (EEA) copolymer; and 10 vol. % heavy mineral oil (HMO) as a lubricant and a plasticizer. An exemplary silver powder composite blend contains the following: 52 vol. % silver powder; 46 vol. % ethylene ethyl acrylate (EEA) copolymer; and 2 vol. % methoxypolyethylene glycol (MPEG) as a lubricant and a plasticizer.

In other embodiments, alternative methods of preparing FM filaments and composite materials may be utilized. Alternative compositions and methods, including those described in the co-pending U.S. patent applications listed in Table 1, which are incorporated by reference herein in their entireties, are contemplated for use with the present invention.

TABLE 1

| TITLE | INVENTORS | FILING DATE | ATTY DOCKET NO. |
|---|---|---|---|
| ALIGNED COMPOSITE STRUCTURES FOR MITIGATION OF IMPACT DAMAGE AND RESISTANCE TO WEAR IN DYNAMIC ENVIRONMENTS | Anthony C. Mulligan Mark J. Rigali Manish P. Sutaria Dragan Popovich | Dec. 4, 2001 | 03248.00038 |
| CONSOLIDATION AND DENSIFICATION METHODS FOR FIBROUS MONOLITH PROCESSING | Manish P. Sutaria Mark J. Rigali Ronald A. Cipriani Gregory J. Artz Anthony C. Mulligan | Dec. 4, 2001 | 03248.00039 |
| METHODS AND APPARATUS FOR PREPARATION OF THREE-DIMENSIONAL BODIES | Anthony C. Mulligan Mark J. Rigali Manish P. Sutaria Gregory J. Artz Felix H. Gafner K. Ranji Vaidayanathan | Dec. 4, 2001 | 03248.00040 |
| COMPOSITE STRUCTURES FOR USE IN HIGH TEMPERATURE APPLICATIONS | Mark J. Rigali Manish P. Sutaria Greg E. Hilmas Anthony C. Mulligan Marlene Platero-AllRunner Mark M. Opeka | Dec. 4, 2001 | 03248.00043 |
| COMPOSITIONS AND METHODS FOR PREPARING MULTIPLE-COMPONENT COMPOSITE MATERIALS | Mark J. Rigali Manish P. Sutaria Felix Gafner Ron Cipriani Randy Egner Randy C. Cook | Dec. 4, 2001 | 03248.00044 |

EXAMPLES

The following examples are intended to illustrate the present invention and should not be construed as in any way limiting or restricting the scope of the present invention.

Example 1

A multi-functional zirconium diboride/boron nitride/boron carbide ($ZrB_2/BN/B_4C$) fibrous monolith composite is prepared in accordance with the present invention. In this composite, $ZrB_2$ is the inner, first ceramic phase, BN is the boundary phase and $B_4C$ is the outer, second ceramic phase. The $ZrB_2/BN/B_4C$ tertiary FM composite system provides at least the following functions: strong structural material capable of withstanding high temperatures, higher fracture toughness as compared to monolithic ceramics, superior thermal shock resistance, power generation, and radiation hardening neutron absorber. The incorporation of an electrical power-generating function may allow for elimination or reduction of batteries or other means for generating electricity on board of a rocket or a hypersonic vehicle, resulting in decreased system complexity, increased reliability, and weight and cost savings. Boron's ability to absorb neutrons provides an additional benefit for the material system. Due to the high density of boron atoms in the hardened tertiary FM system, the system will absorb neutron radiation. Neutron hardened high temperature structural materials are highly desired in the kinetic kill vehicle systems where sensitive electronics are susceptible to neutrons. This material system can also be used as neutron-absorbing shields in nuclear fusion related applications.

Example 2

The resulting mechanical properties of $ZrB_2/BN/B_4C$ as a structural composite include a combination of the properties of the constituent composites ZIRBORON™ and $B_4C$ and are influenced by the tertiary FM architectures. ZIRBORON™ fibrous monoliths have $ZrB_2$ cells and BN cell boundaries. This FM material is an excellent refractory for high temperature oxidative and ablative environments, with good flexure strength, non-catastrophic failure, and high resistance to oxidation, very high melting point, and excellent thermal shock resistance. Basic properties of ZIRBORON™ FM material are presented in Table 2 below.

TABLE 2

| Flexure Strength, σ 4-Point | Total Work-of-Fracture | Melting Point | Thermal Shock Resistance, ΔT = 2000° C. |
|---|---|---|---|
| 320 MPa | 1174 J/m² | 3000° C. | No Failure |

The addition of $B_4C$ to the ZIRBORON™ system maintains the observed thermal and mechanical properties, because $B_4C$ is also a very good structural material. $B_4C$ has good flexure strength (>400 MPa), very high elastic modulus (>400 GPa), high melting point (about 2400° C.), and low density (2.5 g/cm³). Also, $B_4C$ does not react with $ZrB_2$. The thermal expansion match of $B_4C$ (5.6 ppm/K) and $ZrB_2$ (5.9 ppm/K) is very close, and $B_4C$—$ZrB_2$ composites can survive processing and steep thermal gradients without thermo-mechanical failure.

Example 3

A $ZrB_2/BN/B_4C$ fibrous monolith was fabricated and consolidated by hot press at 1950° C. Consolidation conditions for the $ZrB_2/BN/B_4C$ fibrous monolith are provided in Table 3. Mechanical property measurements are presented in Table 4.

TABLE 3

| FM Composition | Volume % of Constituents | Hot Press Pressure (MPa) | Consolidation Time (minutes) | Hot Press Pressure (MPa) |
|---|---|---|---|---|
| $ZrB_2/BN/B_4C$ | 50/25/25 | 27.58 | 60 | 27.58 |

TABLE 4

| FM Composition | Archimedes Density (g/cm³) | Theoretical EMOD (GPa) | Measured EMOD (GPa) | Fracture Stress (MPa) |
|---|---|---|---|---|
| $ZrB_2/BN/B_4C$ | 4.172 ± 0.04 | 350 | 298.5 ± 17.3 | 227.1 ± 29.8 |

Example 4

The zirconium diboride/boron nitride/boron carbide FM composite of Example 3 is used as a power generating system. Boron carbides having atomic carbon percentages between 13.3 and 19 (boron-rich $B_4C$) have high Seebeck coefficients (>100 microvolts/K) and relatively low thermal conductivity. They are p-type small polaronic semiconductors, with good conductivities above 1000 K (about 50 Siemens). This gives them an outstanding thermoelectric figure of merit ZT of 0.5/K at 1000 K. The figure of merit is increased at higher temperatures. Because of the compatibility and excellent thermo-mechanical properties of $B_4C$, the $ZrB_2/BN/B_4C$ system generates electricity, for example, from heat flux. In this system, boron carbide is the p-couple, BN is the insulator, and $ZrB_2$ is the n-couple.

Example 5

The zirconium diboride/boron nitride/boron carbide FM composite of Example 3 is used as a neutron absorbing system. Boron-based materials enriched in the isotope $^{10}B$ can act as structural materials and also provide the added benefit of being hardened to neutron radiation. It is believed that this neutron absorbing performance results from the high neutron capture cross-section of the $^{10}B$. Although $^{10}B$ isotope has a natural abundance of only 19.78% in B, $^{10}B$-enriched $B_4C$, $ZrB_2$ and BN are readily available, with $^{10}B$ enrichments approaching 100%. Using $^{10}B$-enriched boride materials, a nuclear hardened structure ceramic can be developed. The $ZrB_2/BN/B_4C$ system has a high density of $^{10}B$ atoms, increasing the likelihood of neutron capture reactions in the composite casing and eliminating radiation damage to radiation sensitive components. This system, when applied as a missile casing and electronic casing, can prevent neutron-related damage of electronics behind the casing.

Example 6

Ceramic/metal FM structures were fabricated with following compositions: $ZrO_2/Ni$, $Al_2O_3/Ni$, WC/Ni, WC/Nb, HfC/WRe, and ZrC/WRe. Mechanical modeling was utilized to optimize properties when selecting the ratios of each phase. These materials exhibited enhanced work-of-fracture (toughness). It is believed that crack deflection and/or blunting at the ductile phase contributes to the improvement in toughness relative to monolithic ceramics.

Figure 5:
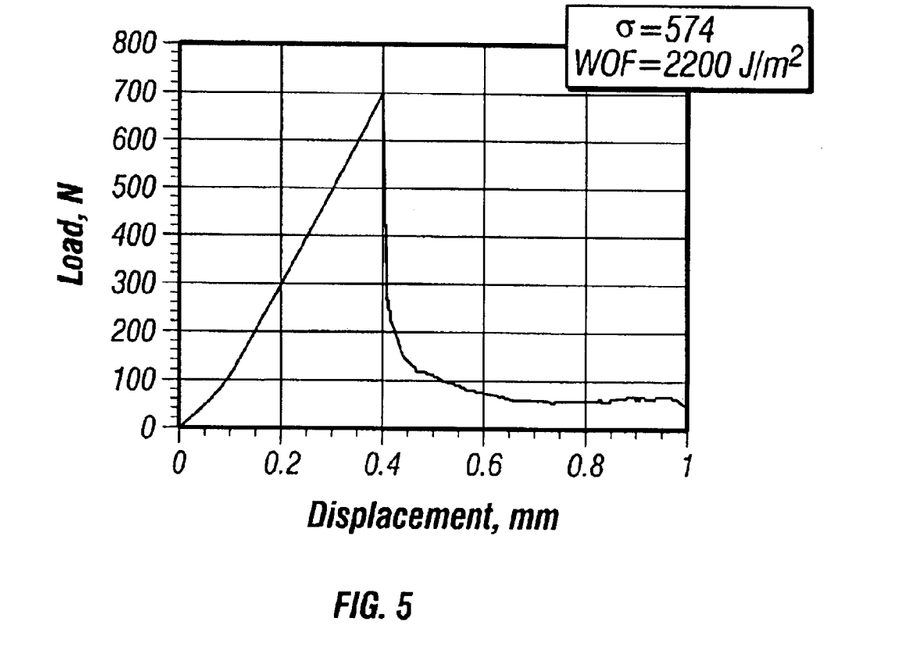
FIG. 5 is a graphical illustration of load as a function of displacement for a fibrous monolith composite in accordance with the present invention.

FIG. 5 represents a typical load-deflection curve observed for a $ZrO_2/Ni$ composite tested in a four-point flexural configuration at room temperature. The sample reached a peak apparent flexural strength of 574 MPa with a slowly declining load-bearing capacity after the first fracture event occurred. This particular sample achieved an inelastic work-of-fracture of 2200 $J/m^2$, roughly 50 times the work-of-fracture of monolithic $ZrO_2$ ceramic.

Adding an outer ceramic phase to a ceramic/metal FM structure provides enhanced structural properties for the entire system.

Example 7

Another system includes a tertiary tungsten carbide/tungsten-iron-nickel metal alloy/tungsten carbide FM composite. As a structural material, this FM exhibits excellent toughness, wear, and abrasion resistance. It also functions as a strain gauge, making it a smart structure suitable for use in high temperature environments. The tertiary ceramic/metal/ceramic FM system provides an outer ceramic phase that acts as an insulator and a metal phase that acts as a separator.

The WC/W—Fe—Ni/WC FM composite may be used as a strain measuring system. At elevated temperatures and under applied load, there is a change in the resistance of the metal phase within this tertiary FM system. The change in the resistance is measured and converted to applied strain, which is accomplished by applying a DC voltage at terminals on test coupons. The measured change in the resistance is calibrated and converted into applied strain on the system. For the FM system to perform as a strain gauge, a junction is needed to join the metal phases at either end. This is achieved during green fabrication by terminating the ends of test coupons.

Coupons with end terminals are prepared. Without modifying the structure, addition of terminals allows the structures to perform multiple functions, including wear/abrasion resistance and monitoring of applied strain. Consequently, structures can be monitored during application for wear damage, lifetime of coatings, and catastrophic failures in structures. For example, putting a tertiary FM coating on drilling bits allows detection of fracture in the drill bit while monitoring strain in the coatings. When the coating fails, the strain does not give any value, indicating a failure in the coating.

Example 8

A PLZT/silver (Ag) filament having an embedded silver electrode along the filament axis is prepared in accordance with the present invention. First, a PLZT composite blend is warm pressed to form a 22 mm PLZT feed rod. The PLZT feed rod is then core drilled to produce a 6 mm central channel within the feed rod. Next, a silver composite blend is warm pressed to form an Ag feed rod. The Ag feed rod is extruded with a ball screw extruder to form a 6 mm extruded Ag rod. The extruded Ag rod is inserted into the PLZT rod to form a composite PLZT/Ag feed rod. The volume fraction of silver in an exemplary composite PLZT/Ag feed rod is approximately 6.5 vol. %.

The composite PLZT/Ag feed rod is extruded into a 2 mm composite single filament, preserving the volume fractions and geometry of the composite feed rod. This composite filament is chopped into sections of equal length, and bundled and reconsolidated into a multi-cellular feed rod. For example, 90 sections of equal length can be bundled and reconsolidated to form a multi-cellular feed rod. The multi-cellular feed rod is extruded to form a 2 mm multi-cellular filament of PLZT containing a hexagonally arrayed lattice of silver elements having a nominal green diameter of about 210 μm.

PLZT/Ag single filaments and PLZT/Ag multi-cellular filaments were sintered at 925° C. for five hours under a protective PbO atmosphere. Ohmmeter measurements of the PLZT/Ag single filament revealed a resistivity <3 ohms over a 15 cm length along the axis. Scanning electron microscopy revealed spherical silver particles within porous channels in the fiber, thus indicating the formation of molten silver.

Numerous modifications to the invention are possible to further enhance the properties of materials that are capable of performing more than one task within a particular system. Thus, modifications and variations in the practice of the invention will be apparent to those skilled in the art upon consideration of the foregoing detailed description of the invention. Although preferred embodiments have been described above and illustrated in the accompanying drawings, there is no intent to limit the scope of the invention to these or other particular embodiments. Consequently, any such modifications and variations are intended to be included within the scope of the following claims.

What is claimed is:

1. A multi-functional fibrous monolith structure including one or more components comprising:

an inner ceramic phase;

an intermediate metal phase; and an outer ceramic phases, the phases being arranged in a predetermined manner and at least one of the phases is effective for performing at least one non-structural function and at least one of the phases capable of bearing mechanical loads and stresses.

2. The multi-functional fibrous monolith structure in claim 1 wherein the intermediate phase is an interface strip deposited in a controlled array format to allow for strain measurement.

3. The multi-functional fibrous monolith structure in claim 2 incorporated in a drill bit insert capable of measuring strain during drilling operation.

4. The multi-functional fibrous monolith structure in claim 2 incorporated in a machine tool capable of measuring strain.

5. The multi-functional fibrous monolith structure in claim 1 wherein the intermediate phase is an interface strip deposited in a controlled array format to allow for temperature measurement.

6. The multi-functional fibrous monolith structure in claim 1 wherein the intermediate phase is an interface strip deposited in a controlled array format to allow the measurement of damage propagation.

7. The multi-functional fibrous monolith structure in claim 1 wherein the intermediate-phase is an interface strip deposited in a controlled array format to allow for temperature measurement and strain measurement.

8. The multi-functional fibrous monolith structure in claim 1 wherein the intermediate phase comprises W and Re.

9. The multi-functional fibrous monolith structure in claim 1 wherein the inner ceramic phase is $ZrB_2$, the intermediate phase is BN, and the outer ceramic phase is $B_4C$.

10. The multi-functional fibrous monolith structure in claim 1 wherein the inner ceramic phase is Tungsten Carbide, the intermediate phase is a Tungsten-Iron-Nickel Alloy, and the outer ceramic phase is Tungsten Carbide.

11. The multi-functional fibrous monolith structure in claim 1 incorporated in rocket nozzle capable of generating an electric current.

12. The multi-functional fibrous monolith structure in claim 1 incorporated in a rocket nozzle capable of measuring temperature.

13. The multi-functional fibrous monolith structure in claim 1 incorporated in a drill bit capable of measuring temperature and strain during drilling operation.

14. The multi-functional fibrous monolith structure in claim 1 incorporated in an electronic casing to prevent neutron-related damage of electronics behind the casing.

15. The multi-functional fibrous monolith structure of claim 1 wherein one or more of the phases contains an electro-mechanically active ceramic material.

16. The multi-functional fibrous monolith structure in claim 15 wherein one or more of the phases contains electrically insulating material.

17. The multi-functional fibrous monolith structure of claim 1 wherein one or more of the phases is piezoelectric.

18. The multi-functional fibrous monolith structure of claim 17 where one or more of the phases contains a ceramic material selected from the group consisting of lead zirconate titanate, lead lanthanum zirconate titanate, lead barium zirconate titanate, lead stannate zirconate titanate, lead magnesium niobate, and mixtures thereof.

19. The multi-functional fibrous monolith structure of claim 18 wherein at least one other phase includes a conductive ceramic, metallic or ceramic-metallic material.

20. The multi-functional fibrous monolith structure of claim 19 wherein the conductive material is generally embedded within the structure and functions as one or more electrodes.

21. The multi-functional fibrous monolith structure of claim 1 wherein the inner ceramic phase and the outer ceramic phase include the essentially same material composition.

22. The multi-functional fibrous monolith structure of claim 1 wherein the structure is capable of generating an electric current.

23. A fibrous monolith composite structure including one or more components comprising:

a first material including a conductive ceramic;

a second material generally surrounding the first material, the second material including a metal alloy; and a third material generally surrounding the second material, the third material selected from the group consisting of piezoelectric ceramics and electrostrictive ceramics and mixtures thereof.

24. The composite structure of claim 23 where the second material is selected from the group consisting of lead zirconate titanate, lead lanthanum zirconate titanate, lead barium zirconate titanate, lead stannate zirconate titanate, lead magnesium niobate, and mixtures thereof.

25. The composite structure of claim 24 wherein the first material includes silver.

26. The composite structure of claim 23 wherein at least one of the first material and second material is generally embedded within the structure and functions as one or more electrodes.

27. The composite structure of claim 23 wherein the third material includes an electrically insulating material.

* * * * *